(12) United States Patent
Iga et al.

(10) Patent No.: US 6,990,131 B2
(45) Date of Patent: Jan. 24, 2006

(54) SEMICONDUCTOR OPTICAL DEVICE AND METHOD OF MANUFACTURING THE SAME

(75) Inventors: Ryuzo Iga, Kanagawa (JP); Susumu Kondo, Tokyo (JP); Matsuyuki Ogasawara, Kanagawa (JP); Yasuhiro Kondo, Kanagawa (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 382 days.

(21) Appl. No.: 10/222,434

(22) Filed: Aug. 16, 2002

(65) Prior Publication Data

US 2003/0067010 A1 Apr. 10, 2003

(30) Foreign Application Priority Data

Aug. 21, 2001 (JP) .................................... 2001-249852

(51) Int. Cl.
    *H01S 5/00* (2006.01)

(52) U.S. Cl. .............................. 372/45; 372/46; 372/50
(58) Field of Classification Search .............. 372/43–50
    See application file for complete search history.

(56) References Cited

U.S. PATENT DOCUMENTS

| 5,717,710 | A |   | 2/1998  | Miyazaki et al. |
| 5,804,840 | A |   | 9/1998  | Kato et al. |
| 5,822,349 | A |   | 10/1998 | Izumiya et al. |
| 6,011,811 | A |   | 1/2000  | Oehlander et al. |
| 6,037,189 | A | * | 3/2000  | Goto ........................... 438/31 |

(Continued)

FOREIGN PATENT DOCUMENTS

| EP | 1139526 A2 | 10/2001 |
| EP | 1256988 A2 | 11/2002 |
| JP | 01-321677 A | 12/1989 |
| JP | 06-275911 A | 9/1994 |
| JP | 09-002145 A | 1/1997 |
| JP | 09-214045 A | 8/1997 |

OTHER PUBLICATIONS

Kondo, Susumu et al.; "Ruthenium–doped semi–insulating InP buried InGaAlAs/InAlAs MQWs modulators", 13th International Conference on InP and Related Materials Post Deadline Papers; May 14–18, 2001; pp. 19–20; Nara, Japan.

Matsumoto, S., et al.; "Highly reliable 1.55μm GaInAsP laser diodes buried with semi–insulating iron–doped InP"; Electronics Letters; Aug. 4, 1994; pp. 1305–1306; vol. 30; No. 16.

(Continued)

*Primary Examiner*—Minsun Oh Harvey
*Assistant Examiner*—Phillip Nguyen
(74) *Attorney, Agent, or Firm*—Squire, Sanders & Dempsey L.L.P.

(57) ABSTRACT

A semiconductor optical device includes a multilayer structure and buried layers. The multilayer structure is constituted by a cladding layer having an n-type conductivity, an active region formed from an active layer or photoabsorption layer, and a cladding layer having a p-type conductivity which are successively formed on a semiconductor substrate having the first crystallographic orientation. The buried layers are made of a ruthenium-doped semi-insulating semiconductor crystal and formed on two sides of the mesa-stripe-like multilayer structure. The electrically activated ruthenium concentration in the ruthenium-doped semi-insulating semiconductor crystal grown on the growth surface having the second crystallographic orientation which is formed in the process of growing the semi-insulating semiconductor crystal is substantially equal to or higher than the electrically activated ruthenium concentration in the ruthenium-doped semi-insulating semiconductor crystal grown on the growth surface having the first crystallographic orientation wherein the second crystallographic orientation is different from the first crystallographic orientation. An integrated light source and a method of manufacturing a semiconductor optical device are also disclosed.

12 Claims, 5 Drawing Sheets

U.S. PATENT DOCUMENTS 6,664,605 B1 * 12/2003 Akulova et al. ............ 257/432
6,717,187 B2 * 4/2004 Kondo et al. ................ 257/183
6,813,298 B2 * 11/2004 Chan et al. .................... 372/45
2002/0187580 A1 * 12/2002 Kondo et al. .................. 438/47
2003/0209771 A1 11/2003 Akulova et al.

OTHER PUBLICATIONS

Kondo, S., et al.; "Ruthenium–doped semi–insulating InP buried InGaAIAs/InAIAs MQWs modulators"; Post Deadline Papers; 13$^{th}$ IPRM; International Conference on Indium Phosphide and Related Materials; May 14–18, 2001; Cover page, Table of Contents and pp. 19–20; Nara, Japan.

van Geelen, A., et al.: "Ruthenium doped high power 1.48 $\mu$m SIPBH laser"; 11$^{th}$ International Conference on Idium Phosphide and Related Materials; May 16–20, 1999; pp. 203–206; Davos, Switzerland.

Söderström, D., et al.; "Dopant Diffusion and Current–Voltage Studies on Epitaxial InP Codoped with Ru and Fe"; Journal of Electronic Materials; accepted Apr. 6, 2001; pp. 972–976; vol. 30, No. 8.

Wakita, K., et al.; "Very–High–Allowability of Incidental Optical Power for Polarization–Insensitive InGaAs/InAIAs Multiple Quantum Well Modulators Buried in Semi–Insulating InP"; Jpn. J. Appl. Phys.; Mar. 1998; pp. 1432–1435; vol. 37, Part 1, No. 3B.

Söderström, D., et al.; "Electrical Characterization of Ruthenium–Doped InP Grown by Low Pressure Hydride Vapor Phase Epitaxy"; Electrochemical and Solid–State Letters, 2001; pp. G53–G55; vol. 4 (6).

Söderström. D., et al.; "Studies on Ruthenium–Doped InP Growth by Low–Pressure Hydride Vapor–Phase Epitaxy"; Journal of The Electrochemical Society; 2001; pp. G375–G378; vol. 148 (7).

Young, E. W. A., et al.; "Zinc–stimulated outdiffusion of iron in InP"; Appl. Phys. Lett.; Jan. 8, 1990; pp. 146–147; vol. 56 (2).

Dadgar, A., et al.; "Growth of Ru doped semi–insulating InP by low pressure metalorganic chemical vapor deposition"; Journal of Crystal Growth; 1998; pp. 69–73; vol. 195.

Takeuchi, Tatsuya, et al.; "Substrate Orientation Dependence of Fe Doping in MOVPE–Grown InP"; Extended Abstracts of the 1993 International Conference on Solid State Devices and Materials; 1993; pp. 285–287.

Dadgar, A, et al.; "Ruthenium: A superior compensator of InP"; Applied Physics Letters; Dec. 28, 1998; pp. 3878–3880; vol. 73, No. 26.

Dadgar, A. et al., "Ruthenium a new thermally stable compensator in InP," 10$^{th}$ International Conference on Indium Phosphide and Related Materials, May 11–15, 1998, pp. 57–59, Tsukuba, Japan.

Kondo, S. et al., "Ruthenium–Doped Semi–Insulating InP––Buried InGaAIAs/InAIAs Multi–Quantum–Well Modulators,"0 Japanese Journal of Applied Physics, Feb. 2002, pp. 1171–1174, vol. 41 No. 2B, Japan Society of Applied Physics, Tokyo, Japan.

Jie, W.Z. et al., "Native–Oxidized INALAS Blocking Layer Buried Heterostructure INGAASP–INP MQW Laser for High–Temperature Operation," IEEE Photonics Technology Letters, Jan. 1999, pp. 3–5, vol. 11 No. 1, IEEE Inc., New York, NY, USA.

* cited by examiner

SEMICONDUCTOR OPTICAL DEVICE AND METHOD OF MANUFACTURING THE SAME

BACKGROUND OF THE INVENTION

The present invention relates to semiconductor optical devices and a method of manufacturing them and, more particularly, to a semiconductor optical device having two sides of an active region buried in a semi-insulating crystal and a method of manufacturing the device.

A semi-insulating buried heterostructure (SIBH) having a semi-insulating layer as a buried layer is used for a semiconductor optical device such as a semiconductor laser diode or semiconductor optical modulator. It is known that when this structure is used for such a device, lower device capacitance and higher speed modulation can be realized than when a p-n buried structure is used. For this reason, a semi-insulating buried heterostructure is indispensable to semiconductor optical modulators and semiconductor optical devices used for a high capacity optical transmission system.

Conventionally, an iron (Fe)-doped semiconductor crystal is generally used for such a semi-insulating buried layer. Of the doped Fe, electrically activated Fe acts as a compensator for supplied from an n-type dopant in the film, thereby forming a high-resistance film.

A problem in this technique is that interdiffusion between iron (Fe) as a dopant in the semi-insulating buried layer and zinc (Zn) as a dopant in a p-cladding layer and p-contact layer of the device occurs at an interface between the Zn-doped layer and the buried layer. As a consequence, zinc is diffused into the semi-insulating buried layer, resulting in a deterioration in the characteristics of the device. This has been a factor that causes a deterioration in the modulation characteristics of the device, in particular. This phenomenon is not limited to Zn but equally applies to other p-impurities (Be, Cd, Mg, and the like).

For this reason, conventionally, the Fe doping concentration into a semi-insulating buried layer (the Fe atom concentration in the film) is limited to be equal to or lower than a concentration at which interdiffusion becomes noticeable. In this case, a sufficiently high resistance cannot be attained.

As disclosed in Japanese Patent Laid-Open No. 6-275911, when a buried layer is doped with Fe in epitaxial growth, even if the same amount of source gas containing Fe is supplied, the doping concentration varies depending on the crystallographic orientation of growth surface as shown in FIG. 5.

FIG. 5 shows the saturation concentrations of Fe electrically activated in semiconductor crystal in various crystallographic orientations (characteristic curve c), the Fe content (doping concentration) when dicyclopentadienyliron (Cp2Fe) is supplied at 10 sccm (characteristic Curve a), and the impurity concentrations at the time of undoped growth (characteristic curve b). The abscissa represents the off angle from the (100) orientation to the [01-1] orientation, with the main crystallographic orientations being indicated by the arrows; and the ordinate, the concentration in $cm^{-3}$.

As is obvious from the characteristic curve a in FIG. 5, the concentration gradually decreases from the (011) facet to the (100) facet at first and reaches its minimum value near the (111)B facet. Thereafter, the concentration gradually increases. That is, when dicyclopentadienyliron (ferrocene, Cp2Fe) is supplied at 10 sccm, the Fe content decreases from the (011) facet to a position near the (111)B facet, and then increases afterward to reach its maximum value near the (311)B facet. Thereafter, the content decreases toward the (100) facet.

As indicated by the characteristic curve b in FIG. 5, the impurity concentration at the time of undoped growth almost linearly increases from the (011) facet to a position near the (111)B facet. Thereafter, the concentration abruptly decreases to become a very small value near the (211)B facet and (311)B facet, and then gradually increases toward the (100) facet.

As is obvious from the characteristic curve a, when a (111)B facet is formed in the burying growth process, the concentration of electrically activated Fe becomes insufficient, and hence a high-resistance crystal cannot be obtained.

As shown in FIG. 6, when a mesa stripe is to be buried, a facet having a crystallographic orientation different from the crystallographic orientation of the substrate is formed near the mesa stripe in the growth process (Japanese Patent Laid-Open No. 6-275911).

FIG. 6 shows changes in a growth surface in the burying growth process. As is understood from FIG. 6, a mesa stripe 10a extends in the [110] direction.

When this mesa stripe 10a is to be buried by the metalorganic vapor phase epitaxy method (MOVPE method), a major growth surface on a side wall of the mesa stripe 10a extends from the (011) facet to the (100) facet through the (111)B facet.

In the burying growth process accompanying such changes in growth surface, if a layer is grown while the flow rate of dicyclopentadienyliron as an Fe source is kept constant, the Fe content considerably decreases after a (111)B facet is formed as compared with that before the (111)B facet is formed. At the same time, the concentration of an impurity other than Fe, which interferes with an increase in resistance, increases. For this reason, the resistivity of a portion grown after the formation of the (111)B facet decreases. As a consequence, a layer having a sufficiently high resistance cannot be formed.

If the Fe doping concentration is increased to improve this, the Fe doping concentration in a portion grown before the formation of the (111)B facet increases. This enhances interdiffusion.

Under the circumstances, the Fe doping concentration has its own upper limit. That is, a buried layer is doped with Fe in growth to a (100) facet up to a concentration at which a high resistance can be obtained, but a sufficiently high resistance cannot be obtained in growth to a (111)B facet exhibiting lower doping efficiency than the (100) facet.

As described above, in the conventional technique, a layer with a sufficiently high resistance cannot be obtained.

Recently, it has been found that in a semi-insulating semiconductor crystal doped with ruthenium (symbol of element: Ru), almost no interdiffusion occurs between Ru and Zn, and the manufacture of a semiconductor laser using Ru-doped semi-insulating buried layers has been reported ("A. Dadger et.al, Applied Physics Letters Vol. 73, No. 26 pp. 3878–3880 (1998)", "A. Van Geelen et.al, 11th International Conference on Indium Phosphide and Related materials TuB 1-2 (1999)").

However, no study has been made on the relationship between the Ru doping concentration and the crystallographic orientation or device characteristics.

In order to obtain satisfactory device characteristics, it is essential to form an optimal semi-insulating buried layer.

For this purpose, for example, a flat buried layer region grown on a (100) facet in a crystallographic orientation of a substrate must be increased in resistance, and the resistance of a buried layer near a side of a buried mesa stripe of the device must be sufficiently increased.

In the burying growth process on a side of a mesa stripe, however, a growth mode occurs in a crystallographic orientation (typically the orientation of (111)B) different from the crystallographic orientation of grown on the (100) facet. For this reason, in the growth method using an Ru doping condition that increases the resistance of only a semiconductor crystal grown on the (100) facet, the resistance of a buried layer on a side of a mesa stripe cannot be sufficiently increased, and hence sufficient device characteristics cannot be obtained.

Demands therefore have arisen for a growth method using an Ru doping condition for a semi-insulating buried layer, under which sufficient device characteristics can be obtained.

SUMMARY OF THE INVENTION

It is, therefore, a main object of the present invention to provide a semiconductor optical device which can make a buried layer on a side of a mesa stripe have a higher resistance than in the prior art, and a method of manufacturing the device.

In order to achieve the above object, according to an embodiment of the present invention, there is provided a semiconductor optical device comprising a multilayer structure constituted by a cladding layer having an n-type conductivity, an active region formed from an active layer or photoabsorption layer, and a cladding layer having a p-type conductivity which are successively formed on a semiconductor substrate having a first crystallographic orientation, and buried layers which are made of a ruthenium-doped semi-insulating semiconductor crystal and formed on two sides of the mesa-stripe-like multilayer structure, wherein an electrically activated ruthenium concentration in the ruthenium-doped semi-insulating semiconductor crystal grown on the second crystallographic orientation which is different from the first crystallographic orientation in the process of growing the semi-insulating semiconductor crystal is substantially equal to or higher than an electrically activated ruthenium concentration in the ruthenium-doped semi-insulating semiconductor crystal grown on the first crystallographic orientation.

According to another aspect of the present invention, there is provided an integrated light source comprising a semiconductor laser placed on a semiconductor substrate having a first crystallographic orientation, and an optical modulator placed adjacent to the semiconductor laser on the same semiconductor substrate, wherein the semiconductor laser and the optical modulator comprise a multilayer structure constituted by at least a cladding layer having an n-type conductivity, an active region, and a cladding layer having a p-type conductivity which are successively formed on a semiconductor substrate having a first crystallographic orientation, and buried layers which are made of a ruthenium-doped semi-insulating semiconductor crystal and formed on two sides of the mesa-stripe-like multilayer structure, and an electrically activated ruthenium concentration in the ruthenium-doped semi-insulating semiconductor crystal grown on the second crystallographic orientation which is different from the first crystallographic orientation in the process of growing the semi-insulating semiconductor crystal is substantially equal to or higher than an electrically activated ruthenium concentration in the ruthenium-doped semi-insulating semiconductor crystal grown on the first crystallographic orientation.

According to still another aspect of the present invention, there is provided a method of manufacturing a semiconductor optical device comprising the step of forming, on a semiconductor substrate having a first crystallographic orientation, a multilayer structure constituted by a cladding layer having an n-type conductivity, an active region formed from an active layer or a photoabsorption layer, and a cladding layer having a p-type conductivity, the step of processing the multilayer structure into a mesa stripe, and the step of burying two sides of the mesa-stripe-like multilayer structure in a ruthenium-doped semi-insulating semiconductor crystal, wherein the burying step includes the step of growing a ruthenium-doped semi-insulating semiconductor crystal in the same first crystallographic orientation as that of the semiconductor substrate, and the step of growing a ruthenium-doped semi-insulating semiconductor crystal in a second crystallographic orientation different from the first crystallographic orientation, and an electrically activated ruthenium concentration in the ruthenium-doped semi-insulating semiconductor crystal grown on the second crystallographic orientation is substantially equal to or higher than an electrically activated ruthenium concentration in the ruthenium-doped semi-insulating semiconductor crystal grown on the first crystallographic orientation.

DESCRIPTION OF THE PREFERRED EMBODIMENTS

The first to fifth embodiments of the present invention will now be described.

First Embodiment

Figure 1:
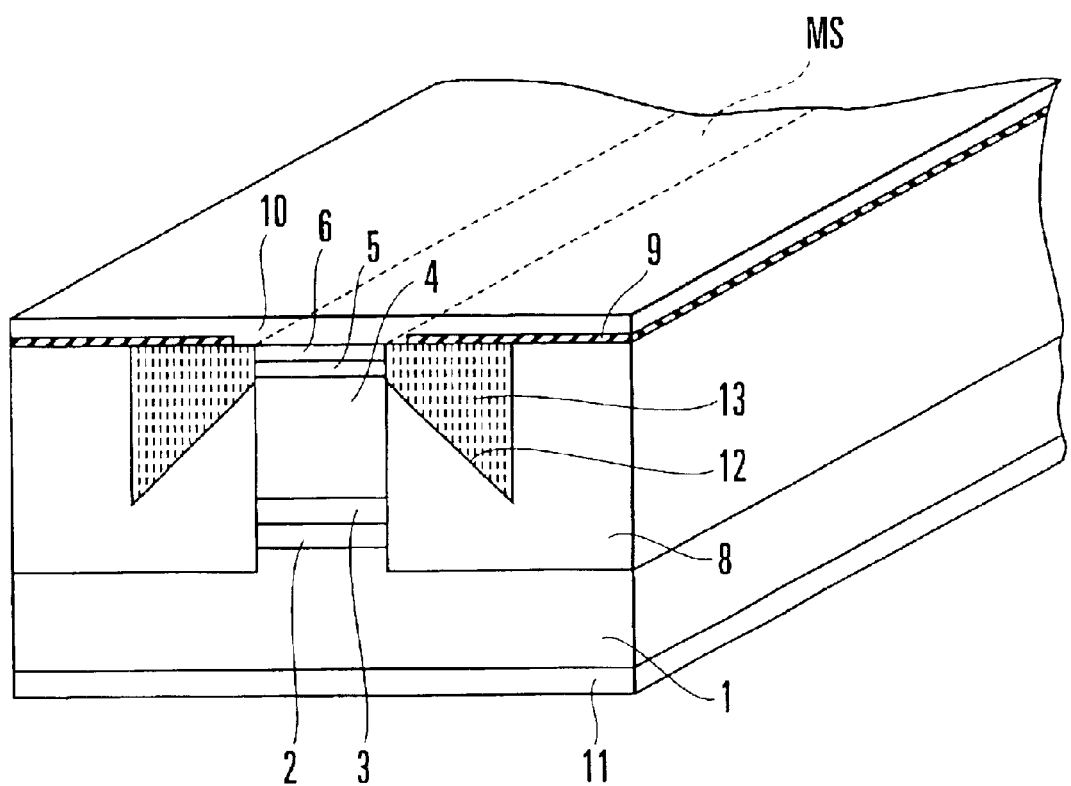
FIG. 1 is a view showing the arrangement of a semiconductor optical device according to the first to third embodiments of the present invention.

FIG. 1 shows the structure of a semiconductor optical device according to the first embodiment of the present invention and, more specifically, a cross-section of a semiconductor laser having an MQW (multiple quantum well) as an active layer. Referring to FIG. 1, a 0.2 $\mu$m-thick Se-doped n-InP cladding layer 2, a 0.15 $\mu$m-thick strained undoped InGaAsP/InGaAsP MQW (multiple quantum well) active layer 3 having a lasing wavelength of 1.55 $\mu$m, a 1.5 $\mu$m-thick Zn-doped p-InP cladding layer 4, a 0.2 $\mu$m-thick Zn-doped p-InGaAsP (bandgap wavelength of 1.3 $\mu$m) contact layer 5, and a 0.3 $\mu$m-thick Zn-doped p-InGaAs contact layer 6 were grown successively on a (100) oriented n-InP substrate 1. With this, a mesa stripe MS having a width of about 2 μm and a height of about 3 μm was formed.

In this case, alloy semiconductors other than the active layer have compositions lattice-matched to the InP substrate unless otherwise specified.

In addition, two sides of the mesa stripe MS are buried in an Ru-doped InP layer 8. A dotted line 12 shown in this Ru-doped InP layer 8 indicates a (111)B facet that appears in the process of growing the Ru-doped InP layer 8.

In general, a hatching portion 13 indicates a portion in which the Ru doping concentration is lower than that in other portions.

That is, since the (111)B facet 12 is formed in the process of growing the Ru-doped InP layer 8, the efficiency of Ru incorporation in the layer grown on the facet becomes lower than in the remaining portions, resulting in a decrease in Ru doping concentration.

A difference between the buried semiconductor optical device of the present invention and that of the prior art will be described below. The semiconductor optical device according to the present invention differs from the conventional device in that the Ru doping concentration in the hatching portion 13 is increased to increase the Ru concentration of this portion to a level at which the portion is electrically activated to sufficiently increase the resistance.

More specifically, the amount of Ru source to be supplied in the burying growth process is increased to increase the Ru doping concentration in the hatching portion 13.

In this manner, the hatching portion 13 was doped with Ru at a concentration almost equal to or higher than the electrically activated Ru concentration to attain a sufficiently high resistance at the growth on the (100) facet. Obviously, portions other than the hatching portion 13 are doped with a larger amount of Ru than the hatching portion 13.

The allowance of increasing the Ru doping concentration originates from unique characteristics of Ru, i.e., Ru being an impurity that makes a semiconductor crystal become a semi-insulating crystal like Fe, and does not cause interdiffusion with a p-impurity such as Zn.

Specific effects will be described next.

Devices were manufactured to respectively have following Ru doping concentrations in the buried layers 8:

(a) $1.5 \times 10^{18}$ cm$^{-3}$
(b) $2 \times 10^{18}$ cm$^{-3}$
(c) $3 \times 10^{18}$ cm$^{-3}$ and the respective characteristics were compared.

In this case, the Ru doping concentrations indicate that Ru atom concentrations become $1.5 \times 10^{18}$ cm$^{-3}$, $2 \times 10^{18}$ cm$^{-3}$, and $3 \times 10^{18}$ cm$^{-3}$ when semiconductor crystals are grown on (100) substrates.

Since the Ru activation ratio on the (100) facet is about 6%, the electrically activated Ru concentration on the (100) facet becomes $6 \times 10^{16}$ cm$^{-3}$ when the Ru doping concentration is $1 \times 10^{18}$ cm$^{-3}$. In the above case, all the resistivities of the buried layers located away from a side of the mesa stripe of the three types of devices were about $10^8$ Ωcm or higher.

The small signal modulation characteristics of directly modulated semiconductor lasers respectively manufactured by forming these three types of devices into chips were, at a 3 dB bandwidth, (a) about 8 GHz when the Ru doping condition for growth on a (100) InP substrate was $1.5 \times 10^{18}$ cm$^{-3}$,
(b) about 15 GHz when the Ru doping condition was $2 \times 10^{18}$ cm$^{-3}$, and
(c) about 15 GHz when the Ru doping condition was $3 \times 10^{18}$ cm$^{-3}$.

The threshold currents were (a) about 20 mA when the Ru doping condition was $1.5 \times 10^{18}$ cm$^{-3}$.
(b) about 10 mA when the Ru doping condition was $2 \times 10^{18}$ cm$^{-3}$, and
(c) about 10 mA when the Ru doping condition was $3 \times 10^{18}$ cm$^{-3}$.

In addition, the optical output efficiencies were (a) about 20% when the Ru doping condition was $1.5 \times 10^{18}$ cm$^{-3}$,
(b) about 35% when the Ru doping condition was $2 \times 10^{18}$ cm$^{-3}$, and
(c) about 35% when the Ru doping condition was $3 \times 10^{18}$ cm$^{-3}$.

At $2 \times 10^{18}$ cm$^{-3}$ or more, sufficient modulation characteristics and sufficient optical output characteristics could be obtained. This means that when the Ru doping concentration was $2 \times 10^{18}$ cm$^{-3}$ or more, the concentration of electrically activated Ru with which the hatching portion 13 was doped became a concentration high enough to increase the resistance of the portion to a sufficiently high level.

Figure 2A:
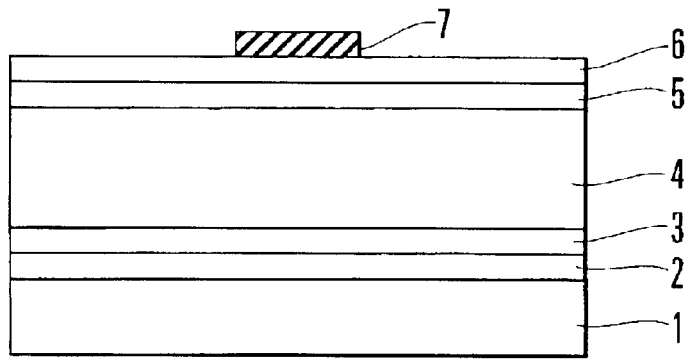
FIGS. 2A to 2D are views showing the steps in methods of manufacturing the semiconductor optical device in FIG. 1 according to the first to third embodiments of the present invention.

A method of manufacturing a semiconductor laser according to this embodiment will be described with reference to FIGS. 2A to 2D. First of all, as shown in FIG. 2A, the 0.2 μm-thick Se-doped n-InP cladding layer 2, the 0.15 μm-thick strained undoped InGaAsP/InGaAsP MQW (multiple quantum well) active layer 3 having a lasing wavelength of 1.55 μm, the 1.5 μm-thick Zn-doped p-InP cladding layer 4, the 0.2 μm-thick Zn-doped p-InGaAsP (bandgap wavelength of 1.3 μm) contact layer 5, and the 0.3 μm-thick Zn-doped p-InGaAs contact layer 6 were grown successively on the (100) oriented n-InP substrate 1 by MOVPE (metalorganic vapor phase epitaxy) method.

In this case, alloy semiconductors other than the active layer have compositions lattice-matched to the InP substrate unless otherwise specified.

Figure 2B:
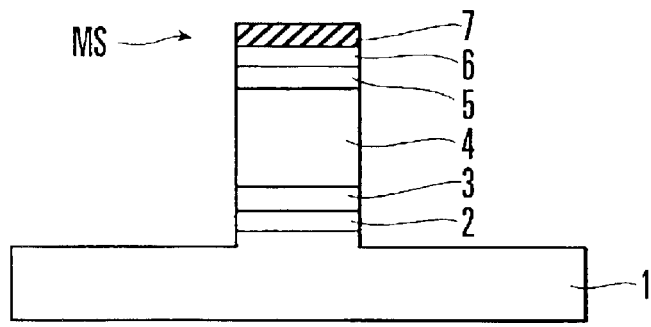

As shown in FIG. 2B, the mesa stripe MS having a width of about 2 μm and a height of about 3 μm was formed by RIE (reactive ion etching) using an SiO$_2$ film 7 as a mask.

Figure 2C:
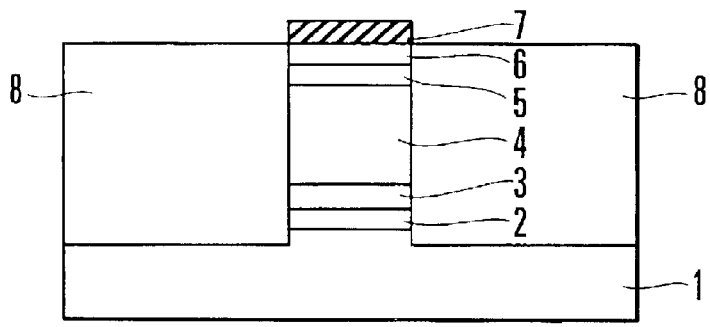

As shown in FIG. 2C, the Ru-doped InP layer 8 (thickness: 3 μm) was formed on the substrate 1, on which the mesa stripe MS was formed, by the MOVPE method. In this case, bis(η 5-2, 4-dimethylpentadienyl)ruthenium(II) was used as an Ru source.

The Ru doping condition during the growth of the buried layer 8 was set such that the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

In practice, buried layers were grown by three types of semi-insulating burying conditions in which when semiconductor crystals were grown on the (100) substrates 1, the Ru doping concentrations became (a) $1.5 \times 10^{18}$ cm$^{-3}$
(b) $2 \times 10^{18}$ cm$^{-3}$, and
(c) $3 \times 10^{18}$ cm$^{-3}$.

Figure 2D:
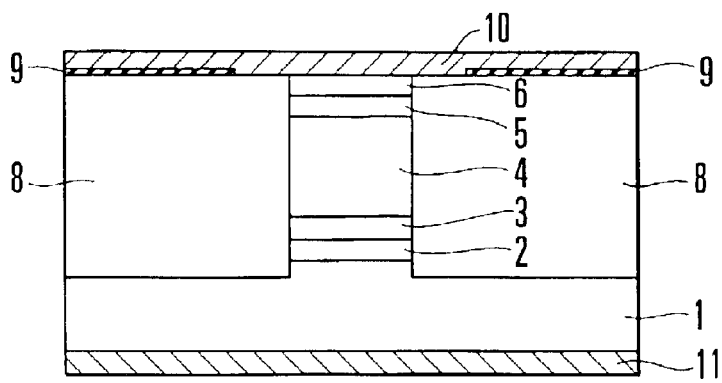

After this process, as shown in FIG. 2D, the SiO$_2$ mask 7 was removed, a p-electrode 10 was formed through an SiO$_2$ mask 9, and an n-type electrode 11 was formed on the bottom surface of the substrate 1.

The resistivity of the buried layer 8 in a planar region located away from a side of the mesa stripe in each of the three types of devices formed under different Ru doping conditions was about $10^8$ Ωcm or more.

The small signal modulation characteristics of directly modulated semiconductor lasers respectively manufactured as chips were, at a 3 dB bandwidth,
 (a) about 8 GHz when the Ru doping condition for growth on the (100) InP substrate was $1.5 \times 10^{18}$ cm$^{-3}$,
 (b) about 15 GHz when the Ru doping condition was $2 \times 10^{18}$ cm$^{-3}$, and
 (c) about 15 GHz when the Ru doping condition was $3 \times 10^{18}$ cm$^{-3}$.

The threshold currents were
 (a) about 20 mA when the Ru doping condition was $1.5 \times 10^{18}$ cm$^{-3}$,
 (b) about 10 mA when the Ru doping condition was $2 \times 10^{18}$ cm$^{-3}$, and
 (c) about 10 mA when the Ru doping condition was $3 \times 10^{18}$ cm$^{-3}$.

In addition, the optical output efficiencies were
 (a) about 20% when the Ru doping condition was $1.5 \times 10^{18}$ cm$^{-3}$,
 (b) about 35% when the Ru doping condition was $2 \times 10^{18}$ cm$^{-3}$ and (c) about 35% when the Ru doping condition was $3 \times 10^{18}$ cm$^{-3}$.

At $2 \times 10^{18}$ cm$^{-3}$ or more, sufficient modulation characteristics and sufficient optical output characteristics could be obtained.

This means that the Ru doping concentration on the (100) facet was $2 \times 10^{18}$ cm$^{-3}$ or more, and the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

Second Embodiment

In the second embodiment of the present invention, an electroabsorption modulator using InGaAsP/InGaAsP is formed in an active layer (multiple quantum well) 3. The structure of the device of the second embodiment is almost the same as that of the first embodiment, and hence will be described with reference to FIGS. 2A to 2D.

First of all, as shown in FIG. 2A, a 0.2 μm-thick Se-doped n-InP cladding layer 2, a 0.15 μm-thick strained undoped InGaAsP/InGaAsP MQW (multiple quantum well) photoabsorption layer 3, a 1.5 μm-thick Zn-doped p-InP cladding layer 4, the 0.2 μm-thick Zn-doped p-InGaAsP (bandgap wavelength of 1.3 μm) contact layer 5, and the 0.3 μm-thick Zn-doped p-InGaAs contact layer 6 were grown successively on a (100) oriented n-InP substrate 1 by the MOVPE method (metalorganic vapor phase epitaxy method). Note that alloy semiconductors other than the photoabsorption layer have compositions lattice-matched to the InP substrate unless otherwise specified.

As shown in FIG. 2B, a mesa stripe MS having a width of about 2 μm and a height of about 3 μm was formed by RIE (reactive ion etching) using a silicon oxide film (SiO$_2$) 7 as a mask.

As shown in FIG. 2C, an Ru-doped indium phosphide (InP) layer 8 (thickness: 3 μm) was formed on the substrate 1, on which the mesa stripe MS was formed, by the MOVPE method. In this case, bis(η 5-2, 4-dimethylpentadienyl) ruthenium(II) was used as an Ru source.

The Ru doping condition during the growth of the buried layer 8 was set such that the electrically activated Ru concentration in the Ru-doped InP layer grown on a (111)B facet 12 became almost equal to or higher than the electrically activated Ru concentration at which the Ru-doped InP layer grown on the (100) crystal face has a sufficiently high resistance.

In practice, buried layers were grown by three types of semi-insulating burying conditions in which when semiconductor crystals were grown on the (100) substrates 1, the Ru doping concentrations became
 (a) $1.5 \times 10^{18}$ cm$^{-3}$
 (b) $2 \times 10^{18}$ cm$^{-3}$, and
 (c) $3 \times 10^{18}$ cm$^{-3}$.

After this process, as shown in FIG. 2D, the SiO$_2$ mask 7 was removed, a p-electrode 10 was formed through an SiO$_2$ mask 9, and an n-type electrode 11 was formed on the bottom surface of the substrate 1. The resistivity of the buried layer in a planar region located away from a side of the mesa stripe in each of the three types of devices formed under different Ru doping conditions was about $10^8$ Ωcm or more.

The small signal modulation characteristics of external optical modulators respectively manufactured as chips were, at a 3 dB bandwidth,
 (a) about 10 GHz when the Ru doping condition for growth on the (100) InP substrate was $1.5 \times 10^{18}$ cm$^{-3}$,
 (b) about 20 GHz when the Ru doping condition was $2 \times 10^{18}$ cm$^{-3}$, and
 (c) about 20 GHz when the Ru doping condition was $3 \times 10^{18}$ cm$^{-3}$.

Therefore, sufficient modulation characteristics were obtained at $2 \times 10^{18}$ cm$^{-3}$ or more.

This means that when the Ru doping concentration on the (100) facet was $2 \times 10^{18}$ cm$^{-3}$ or more, the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

Third Embodiment

In the third embodiment of the present invention, an electroabsorption modulator using InGaAsP/InAlAs is formed in a multiple quantum well layer.

The structure of the device used in the third embodiment is almost the same as that of the first embodiment, and hence will be described with reference to FIGS. 2A to 2D.

First of all, as shown in FIG. 2A, a 0.2 μm-thick Se-doped n-InP cladding layer 2, a 0.15 μm-thick strained undoped InGaAsP/InAlAs MQW (multiple quantum well) photoabsorption layer 3, a 1.5 μm-thick Zn-doped p-InP cladding layer 4, the 0.2 μm-thick Zn-doped p-InGaAsP (bandgap wavelength of 1.3 μm) contact layer 5, and the 0.3 μm-thick Zn-doped p-InGaAs contact layer 6 were grown successively on a (100) oriented n-InP substrate 1 by the MOVPE method (metalorganic vapor phase epitaxy method). Note that alloy semiconductors other than the photoabsorption layer have compositions lattice-matched to the InP substrate unless otherwise specified.

As shown in FIG. 2B, a mesa stripe MS having a width of about 2 μm and a height of about 3 μm was formed by RIE (reactive ion etching) using a silicon oxide film (SiO$_2$) 7 as a mask.

As shown in FIG. 2C, an Ru-doped indium phosphide (InP) layer 8 (thickness: 3 μm) was formed on the substrate 1, on which the mesa stripe MS was formed, by the MOVPE method. In this case, bis(η 5-2, 4-dimethylpentadienyl) ruthenium(II) was used as an Ru source.

The Ru doping condition during the growth of the buried layer was set such that the electrically activated Ru concentration in the Ru-doped InP layer grown on a (111)B facet 12 became almost equal to or higher than the electrically activated Ru concentration at which the Ru-doped InP layer grown on the (100) crystal face has a sufficiently high resistance.

In practice, buried layers were grown by three types of semi-insulating burying conditions in which when semiconductor crystals were grown on the (100) substrates 1, the Ru doping concentrations became
   (a) $1.5 \times 10^{18}$ cm$^{-3}$
   (b) $2 \times 10^{18}$ cm$^{-3}$, and
   (c) $3 \times 10^{18}$ cm$^{-3}$.

After this process, as shown in FIG. 2D, the SiO$_2$ mask 7 was removed, a p-electrode 10 was formed through an SiO$_2$ mask 9, and an n-type electrode 11 was formed on the bottom surface of the substrate 1.

The resistivity of the buried layer in a planar region located away from a side of the mesa stripe in each of the three types of devices formed under different Ru doping conditions was about $10^8$ Ωcm or more.

The small signal modulation characteristics of external optical modulators respectively manufactured as chips were, at a 3 dB bandwidth,
   (a) about 8 GHz when the Ru doping condition for growth on the (100) InP substrate was $1.5 \times 10^{18}$ cm$^{-3}$,
   (b) about 16 GHz when the Ru doping condition was $2 \times 10^{18}$ cm$^{-3}$, and
   (c) about 16 GHz when the Ru doping condition was $3 \times 10^{18}$ cm$^{-3}$.

Therefore, sufficient modulation characteristics were obtained at $2 \times 10^{18}$ cm$^{-3}$ or more.

This means that when the Ru doping concentration on the (100) facet was $2 \times 10^{18}$ cm$^{-3}$ or more, the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

Fourth Embodiment

The fourth embodiment of the present invention exemplifies a semiconductor laser having an InGaAsP/InGaAsP MQW layer as an active layer. A method of manufacturing this laser will be described with reference to FIGS. 3A to 3D.

Figure 3A:
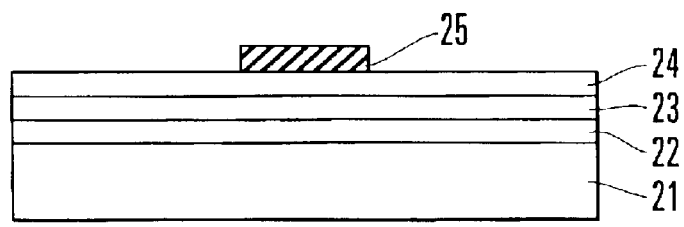
FIGS. 3A to 3D are views showing the steps in a method of manufacturing a semiconductor optical device according to the fourth embodiment of the present invention.

First of all, as shown in FIG. 3A, a 0.2 μm-thick Se-doped n-InP cladding layer 22, a 0.15 μm-thick strained undoped InGaAsP/InGaAsP MQW (multiple quantum well) active layer 23 having a lasing wavelength of 1.55 μm, and a 0.3 μm-thick Zn-doped p-InP cladding layer 24 were grown successively on a (100) oriented n-InP substrate 21 by the MOVPE method (metalorganic vapor phase epitaxy method).

Figure 3B:
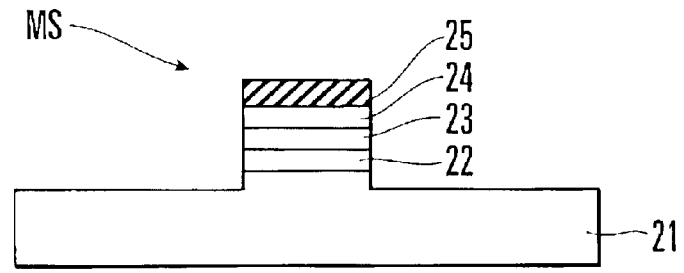

As shown in FIG. 3B, a mesa stripe MS having a width of about 2 μm and a height of about 1.5 μm was formed by RIE (reactive ion etching) using an SiO$_2$ layer as a mask 25.

Figure 3C:
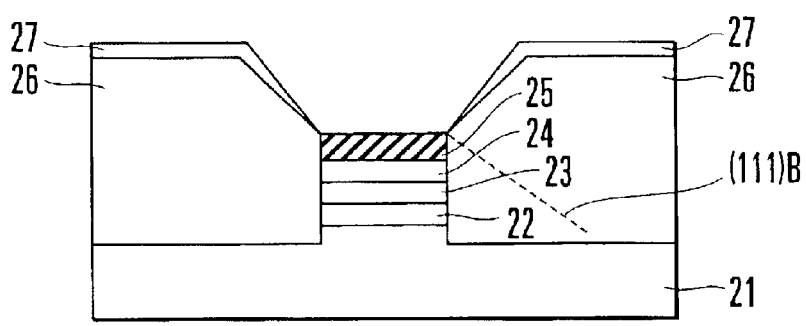

As shown in FIG. 3C, an Ru-doped indium phosphide (InP) layer 26 (thickness: 3 μm) was formed on the substrate 21, on which the mesa stripe MS was formed, by the MOVPE method. In this case, bis(η 5-2, 4-dimethylpentadienyl)ruthenium(II) was used as an Ru source.

The Ru doping condition during the growth of the buried layer was set such that the electrically activated Ru concentration in the Ru-doped InP layer grown on a (111)B facet became almost equal to or higher than the electrically activated Ru concentration at which the Ru-doped InP layer grown on the (100) crystal face has a sufficiently high resistance.

In practice, buried layers were grown by three types of semi-insulating burying conditions in which when semiconductor crystals were grown on the (100) substrates 1, the Ru doping concentrations became
   (a) $1.5 \times 10^{18}$ cm$^{-3}$
   (b) $2 \times 10^{18}$ cm$^{-3}$, and
   (c) $3 \times 10^{18}$ cm$^{-3}$.

Furthermore, as shown in FIG. 3C, a 0.3 μm-thick Se-doped n-InP buried layer 27 was grown.

Figure 3D:
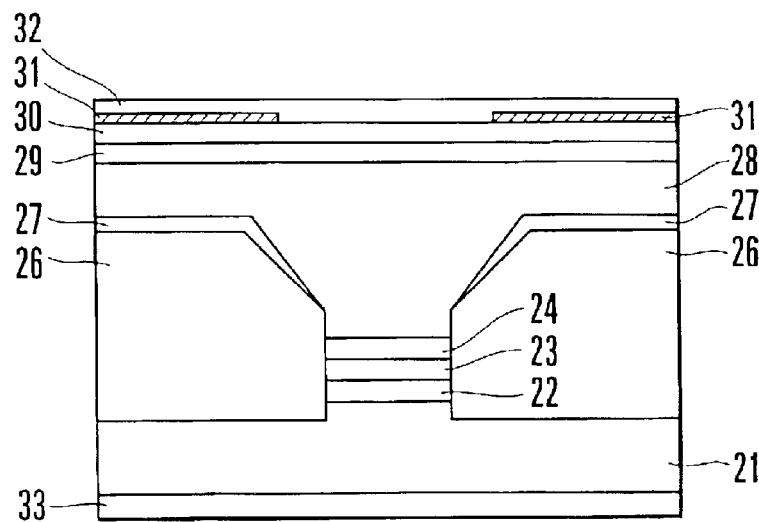
Figure 4:
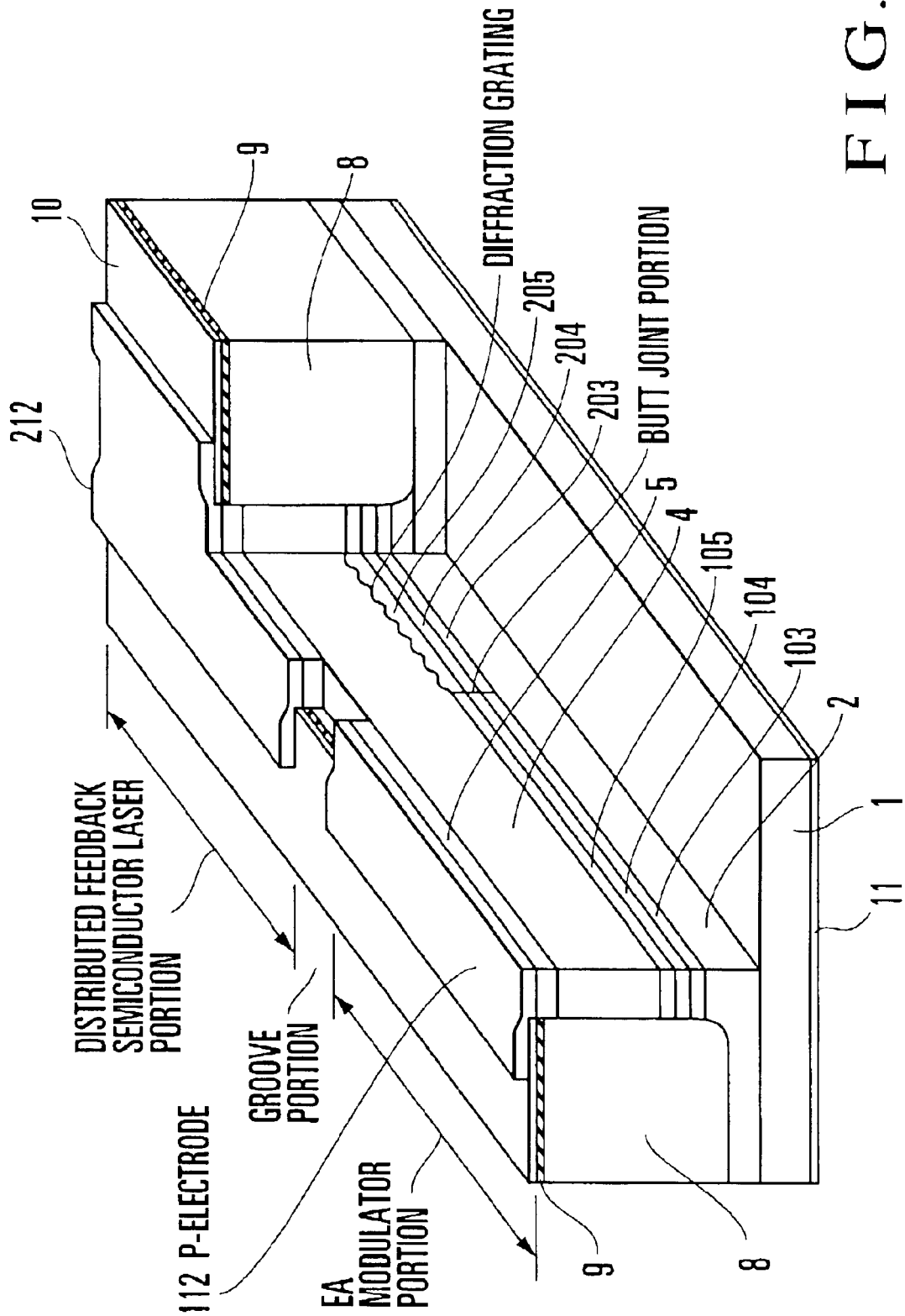
FIG. 4 is a view showing the arrangement of an integrated light source formed from a combination of a semiconductor laser and an optical modulator according to the fifth embodiment of the present invention.
Figure 5:
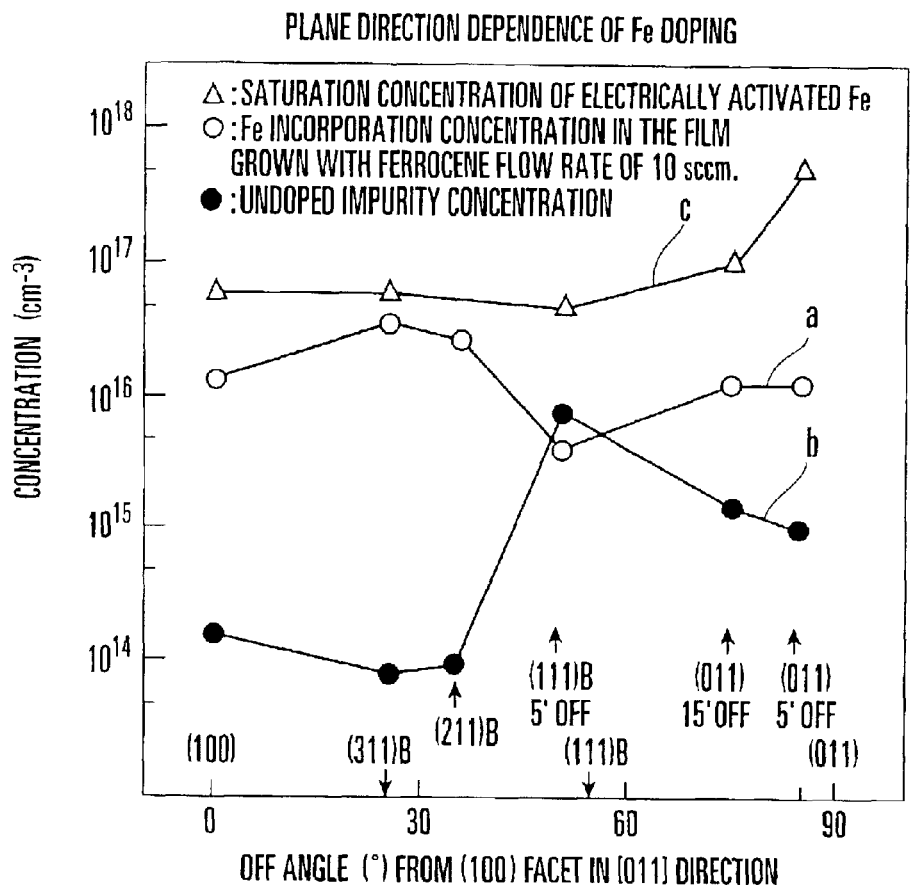
FIG. 5 is a graph showing the crystallographic orientation dependence of Fe doping.
Figure 6:
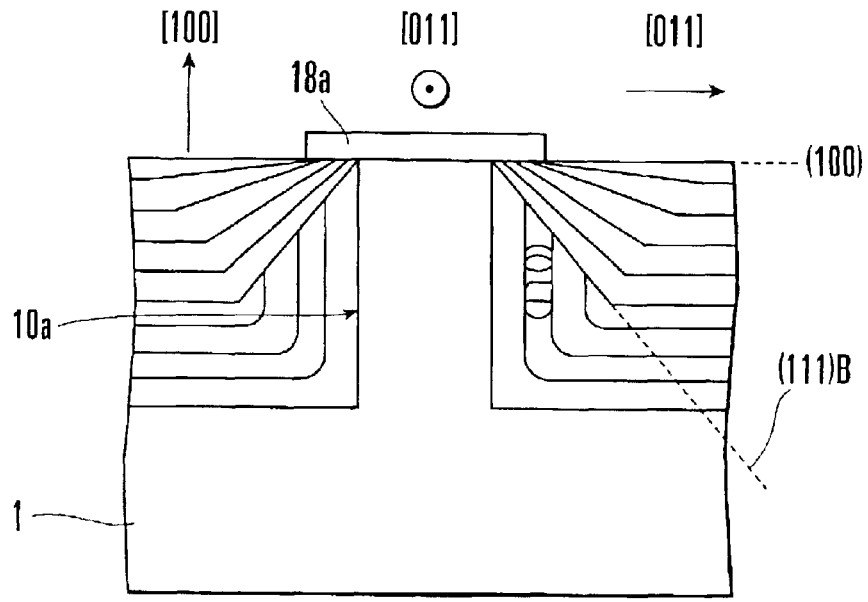
FIG. 6 is a view for explaining how a growth surface changes in the burying growth process.

As shown in FIG. 3D, the silicon oxide film (SiO$_2$) mask 25 was removed, and a 2 μm-thick Zn-doped p-InP cladding layer 28, a 0.2 μm-thick Zn-doped p-InGaAsP (bandgap wavelength: 1.3 μm) contact layer 29, and a 0.3 μm-thick Zn-doped p-InGaAs contact layer 30 were grown successively on the resultant structure. In this case, alloy semiconductors other than the active layer have compositions lattice-matched to the InP substrate 21 unless otherwise specified.

As shown in FIG. 3D, a p-electrode 32 was formed and, an n-electrode 33 was formed on the substrate side.

The resistivity of the buried layer in a planar region located away from a side of the mesa stripe in each of the three types of devices formed under different Ru doping conditions was about $10^8$ Ωcm or more.

The small signal modulation characteristics of directly modulated semiconductor lasers respectively manufactured as chips were, at a 3 dB bandwidth,
   (a) about 6 GHz when the Ru doping condition for growth on the (100) InP substrate was $1.5 \times 10^{18}$ cm$^{-3}$,
   (b) about 12 GHz when the Ru doping condition was $2 \times 10^{18}$ cm$^{-3}$, and
   (c) about 12 GHz when the Ru doping condition was $3 \times 10^{18}$ cm$^{-3}$.

The threshold currents were
   (a) about 15 MA when the Ru doping condition was $1.5 \times 10^{18}$ cm$^{-3}$,
   (b) about 9 mA when the Ru doping condition was $2 \times 10^{18}$ cm$^{-3}$, and
   (c) about 9 mA when the Ru doping condition was $3 \times 10^{18}$ cm$^{-3}$.

In addition, the optical output efficiencies were
   (a) about 27% when the Ru doping condition was $1.5 \times 10^{18}$ cm$^{-3}$,
   (b) about 37% when the Ru doping condition was $2 \times 10^{18}$ cm$^{-3}$, and
   (c) about 37% when the Ru doping condition was $3 \times 10^{18}$ cm$^{-3}$.

At $2 \times 10^{18}$ cm$^{-3}$ or more, sufficient modulation characteristics and sufficient optical output characteristics could be obtained.

This means that the Ru doping concentration on the (100) facet was $2 \times 10^{18}$ cm$^{-3}$ or more, and the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

In the above embodiment, an InP crystal is used for a buried layer. Obviously, however, a material lattice-matched to InP, e.g., InGaAlAs, InAlAs, or InGaAsP can also be effectively used. In addition, InGaAsP, InGaAlAs, InAlAs MQW layers are used for multiple quantum well layers. Obviously, however, the present invention can also be effectively applied to structures such as bulk and multiple quantum well layers in all systems using InP substrates, including an InP-InGaAsP-InGaAs system, InAlAs system, InGaAlAs system, and InGaAs system.

Although Zn and Se are respectively exemplified as a p-impurity and n-impurity, the present invention can obtain the same effect as described above by using other additives having the same conductivities as those of the above impurities.

In this embodiment, the semiconductor lasers and optical modulators have been described. Obviously, however, the present invention can also be effectively applied to other semiconductor devices such as semiconductor amplifiers and photodiodes, single devices, and integrated devices such as an optical modulator integrated semiconductor laser and a semiconductor amplifier/optical modulator integrated device. A light source with integrated semiconductor laser and optical modulator will be exemplified below.

Fifth Embodiment

The fifth embodiment of the present invention is an integrated light source formed by monolithically integrating an electroabsorption optical modulator (EA-M) and distributed feedback laser (DFB-LD). Note that the same reference numerals as in FIG. 1 denote the same parts in this embodiment.

This integrated light source is constituted by the electroabsorption optical modulator EA-M and distributed feedback laser portion DFB-LD which oppose each other through a groove portion GP.

More specifically, the electroabsorption optical modulator (EA-M) was formed as follows. A 0.2 μm-thick Se-doped n-InP cladding layer 2, a 40 nm-thick undoped InGaAsP guide layer 103 having a bandgap wavelength of 1.2 μm, a 0.15 μm-thick strained undoped InGaAsP/InGaAsP MQW (multiple quantum well) photoabsorption layer 104 having an absorption wavelength edge of 1.50 μm, a 40 nm-thick undoped InGaAsP guide layer 105 having a bandgap wavelength of 1.3 μm, a 1.5 μm-thick Zn-doped p-InP cladding layer 4, and a 0.3 μm-thick Zn-doped p-InGaAsP contact layer 5 were stacked successively on the (100) oriented n-InP substrate 1.

Note that alloy semiconductors other than the photoabsorption layer 104 have compositions lattice-matched to the InP substrate 1 unless otherwise specified.

These layers were formed into a mesa stripe having a width of about 2 μm and a height of about 3 μm with its two side surfaces being buried in an Ru-doped InP layer 8.

After an $SiO_3$ passivation film 9 is formed on a surface other than a surface immediately above the mesa stripe, a p-electrode 10 was formed, and a common n-electrode 11 was formed on the substrate side.

The distributed feedback semiconductor laser portion (DFB-LD) was formed as follows. The 0.2 μm-thick Se-doped n-InP cladding layer 2, a 40 μm-thick undoped InGaAsP guide layer 203 having a bandgap wavelength of 1.3 μm, a 0.15 μm-thick strained undoped InGaAsP/InGaAsP MQW (multiple quantum well) active layer 204 having a lasing wavelength of 1.55 μm, a 40 nm-thick undoped InGaAsP guide layer 205 having a bandgap wavelength of 1.3 μm and a diffraction grating formed on its upper surface, a 1.5 μm-thick Zn-doped p-InP cladding layer 4, and a 0.3 am-thick Zn-doped p-InGaAsP contact layer 5 were successively stacked on the above n-InP substrate.

In this case, the alloy semiconductor layer forming the active layer 204 has a composition lattice-matched to the InP substrate 1 unless otherwise specified.

These layers were formed into a mesa stripe having a width of about 2 μm and a height of about 3 μm with its two side surfaces being buried in the Ru-doped InP layer 8.

After the $SiO_3$ passivation film 9 is formed on a surface other than a surface immediately above the mesa stripe, the p-electrode 10 was formed, and the common n-electrode 11 was formed on the substrate side.

In the groove portion, the photoabsorption layer 104 and active layer 204 were optically coupled to each other by a butt-joint configuration. In order to ensure electric insulation, the InGaAsP contact layer 5 was removed.

The mesa stripe structure and the Ru-doped InP layer 8 as a buried layer are common to the electroabsorption optical modulator portion (EA-M), distributed feedback semiconductor laser portion (DFB-LD), and groove portion (GP).

The buried layer 8 was formed by growing Ru-doped InP by the MOVPE method.

In this case, bis(n 5-2, 4-dimethylpentadienyl)ruthenium (II) was used as an Ru source.

The Ru doping condition during the growth of the buried layer 8 was set such that the electrically activated Ru concentration in the Ru-doped InP layer grown on a (111)B facet 12 became almost equal to or higher than the electrically activated Ru concentration at which the Ru-doped InP layer grown on the (100) crystal face has a sufficiently high resistance.

In practice, buried layers were grown by three types of semi-insulating burying conditions in which when semiconductor crystals were grown on (100) substrates, the Ru doping concentrations became (a) $1.5 \times 10^{18}$ cm$^{-3}$ (b) $2 \times 10^{18}$ cm$^{-3}$, and (c) $3 \times 10^{18}$ cm$^{-3}$.

The resistivity of the buried layer 8 in a planar region located away from a side of the mesa stripe in each of the three types of devices formed under different Ru doping conditions was about $10^8$ ΩCm or more.

The small signal modulation characteristics of EA-DFB lasers respectively manufactured as chips were, at a 3 dB bandwidth, (a) about 7 GHz when the Ru doping condition for growth on a (100) InP substrate was $1.5 \times 10^{18}$ cm$^{-3}$, (b) about 12 GHz when the Ru doping condition was $2 \times 10^{18}$ cm$^{-3}$, and (c) about 12 GHz when the Ru doping condition was $3 \times 10^{18}$ cm$^{-3}$.

Therefore, sufficient modulation characteristics could be obtained at $2 \times 10^{18}$ cm$^{-3}$ or more.

This means that when the Ru doping concentration on a (100) facet was $2 \times 10^{18}$ cm$^{-3}$ or more, the electrically activated Ru concentration in the Ru-doped InP layer grown on the (111)B facet 12 became almost equal to or higher than the electrically activated Ru concentration at which the Ru-doped InP layer grown on the (100) crystal face has a sufficiently high resistance.

As described above, the present invention relates to an improvement in the performance of a buried semiconductor optical device, and is characterized in that the doping concentration is controlled when a semi-insulating buried layer doped with ruthenium has a plurality of crystallographic orientations. This makes it possible to form a sufficient semi-insulating buried layer on a side of a mesa stripe.

As has been described in detail above on the basis of the embodiments, according to the present invention, the electrically activated Ru concentration in an Ru-doped semi-insulating semiconductor crystal formed on a crystal face having the second crystallographic orientation which appears in the burying growth process is set to be equal to or higher than an electrically activated Ru concentration at which the Ru-doped semi-insulating semiconductor crystal grown on a crystal face having the first crystallographic orientation has a sufficiently high resistance. This makes it possible to obtain the noticeable effect of obtaining a high-performance buried semiconductor device.

This embodiment has exemplified the integrated light source in which an active layer of a semiconductor laser and a photoabsorption layer of an optical modulator are coupled by using a butt-joint configuration. However, the present invention is not limited to this. Identical multiple quantum well (MQW) layers each having an active layer and photoabsorption layer grown together may be used, in which the bandgap energy of the active layers is small, and the bandgap energy of the photoabsorption layers is large. In this case, a known selective area growth method may be used to form the active layers and photoabsorption layers (Japanese Patent Laid-Open No. 1-321677).

More specifically, mask-stripe-like SiO$_2$ masks are placed on only two sides of a region where an active layer is to be grown, and a multiple quantum well structure is grown by the metalorganic vapor phase epitaxy method. In the region sandwiched between the mask stripes, the well layer becomes thick. The bandgap energy of this region is therefore smaller than that of the remaining regions.

What is claimed is:

1. A semiconductor optical device comprising:
    a multilayer structure formed mesa-stripe-like constituted by a first cladding layer having an n-type conductivity, an active region formed from an active layer or photoabsorption layer, and a second cladding layer having a p-type conductivity which are successively formed on a semiconductor substrate having a first crystallographic orientation; and
    buried layers which are made of a ruthenium-doped semi-insulating semiconductor crystal and formed on two sides of said mesa-stripe-like multilayer structure;
    wherein a first electrically activated ruthenium concentration in the ruthenium-doped semi-insulating semiconductor crystal grown on the growth surface having a second crystallographic orientation which is formed in the process of growing the semi-insulating semiconductor crystal is substantially equal to or higher than a second electrically activated ruthenium concentration in the ruthenium-doped semi-insulating semiconductor crystal grown on the growth surface having first crystallographic orientation; and
    the second crystallographic orientation is different from the first crystallographic orientation.

2. A device according to claim 1, wherein the active region is formed from an active layer so as to form a semiconductor laser.

3. A device according to claim 1, wherein the active region is formed from a photoabsorption layer constituting an electroabsorption modulator.

4. A device according to claim 1, further comprising a second cladding layer constituting said multilayer structure and an electrode formed on a bottom surface of the semiconductor substrate.

5. A device according to claim 1, wherein the semiconductor substrate is InP, and
    said buried layer is ruthenium-doped InP.

6. A device according to claim 1, wherein
    the semiconductor substrate is InP, and
    said buried layer is ruthenium-doped InAlAs.

7. A device according to claim 1, wherein
    the semiconductor substrate is InP, and
    said buried layer is ruthenium-doped InGaAs.

8. A device according to claim 1, wherein
    the semiconductor substrate is InP, and
    said buried layer is ruthenium-doped InGaAsP.

9. A device according to claim 1, wherein the semiconductor substrate is (100) oriented n-InP.

10. An integrated light source comprising:
    a semiconductor laser placed on a semiconductor substrate having a first crystallographic orientation; and
    an optical modulator placed adjacent to said semiconductor laser on the same semiconductor substrate;
    wherein said semiconductor laser and said optical modulator comprise
    a multilayer structure formed mesa-stripe-like constituted by at least a first cladding layer having an n-type conductivity, an active region, and a second cladding layer having a p-type conductivity which are successively formed on a semiconductor substrate having a first crystallographic orientation; and
    buried layers which are made of a ruthenium-doped semi-insulating semiconductor crystal and formed on two sides of the mesa-stripe-like multilayer structure; and
    an electrically activated ruthenium concentration in the ruthenium-doped semi-insulating semiconductor crystal grown on the growth surface having a second crystallographic orientation which is formed in the process of growing the semi-insulating semiconductor crystal is substantially equal to or higher than an electrically activated ruthenium concentration in the ruthenium-doped semi-insulating semiconductor crystal grown on the growth surface having first crystallographic orientation; and
    the second crystallographic orientation is different from the first crystallographic orientation.

11. A method of manufacturing a semiconductor optical device comprising:
    forming, on a semiconductor substrate having a first crystallographic orientation, a multilayer structure constituted by a cladding layer having an n-type conductivity, an active region formed from an active layer or a photoabsorption layer, and a cladding layer having a p-type conductivity;
    processing the multilayer structure into a mesa stripe; and
    burying two sides of the mesa-stripe-like multilayer structure in a ruthenium-doped semi-insulating semiconductor crystal;
    wherein a first electrically activated ruthenium concentration in the ruthenium-doped semi-insulating semiconductor crystal grown on the growth surface having the second crystallographic orientation is substantially equal to or higher than a second electrically activated ruthenium concentration in the ruthenium-doped semi-insulating semiconductor crystal grown on the growth surface having the first crystallographic orientation; and
    the second crystallographic orientation is different from the first crystallographic orientation.

12. A method according to claim 11, wherein
    the semiconductor substrate is n-InP,
    the first crystallographic orientation is (100), and
    the second crystallographic orientation is (111)B or an orientation near (111)B.

* * * * *